United States Patent [19]
Dreyer et al.

[11] Patent Number: 5,479,652
[45] Date of Patent: Dec. 26, 1995

[54] MICROPROCESSOR WITH AN EXTERNAL COMMAND MODE FOR DIAGNOSIS AND DEBUGGING

[75] Inventors: Robert S. Dreyer, Sunnyvale; Donald B. Alpert, Santa Clara; Nimish H. Modi, San Jose, all of Calif.; Mike J. Tripp, Forest Grove, Oreg.

[73] Assignee: Intel Corporation, Santa Clara, Calif.

[21] Appl. No.: 327,229

[22] Filed: Oct. 21, 1994

Related U.S. Application Data

[63] Continuation of Ser. No. 874,642, Apr. 27, 1992, abandoned.

[51] Int. Cl.⁶ .................................................. G06F 11/34
[52] U.S. Cl. ........................... 395/183.06; 364/265.6; 364/267.91; 364/DIG. 1; 395/375; 395/183.08; 395/800
[58] Field of Search ............................ 371/15.1, 16.1, 371/19, 22.1; 364/265.6, 267.91; 395/575

[56] References Cited

U.S. PATENT DOCUMENTS

| | | | |
|---|---|---|---|
| 3,639,911 | 2/1972 | Frieband et al. | 346/172.5 |
| 3,805,245 | 4/1974 | Brooks et al. | 340/172.5 |
| 3,937,938 | 2/1976 | Matthews . | |
| 4,010,448 | 3/1977 | Bennett | 340/172.5 |
| 4,200,912 | 4/1980 | Harrington et al. | 364/200 |
| 4,236,204 | 11/1980 | Groves | 364/200 |

(List continued on next page.)

FOREIGN PATENT DOCUMENTS

| | | | |
|---|---|---|---|
| 0034910 | 9/1981 | European Pat. Off. | H01L 21/22 |
| 0180476 | 5/1986 | European Pat. Off. | G06F 9/26 |
| 0265949 | 5/1988 | European Pat. Off. | G06F 11/00 |
| 0273070 | 7/1988 | European Pat. Off. | G06F 9/22 |
| 0313848 | 3/1989 | European Pat. Off. . | |
| 56-60959 | 5/1981 | Japan | G06F 15/06 |
| 62-5446 | 1/1987 | Japan | G06F 15/06 |
| 1580846 | 6/1977 | United Kingdom | G06F 11/30 |
| 8201105 | 3/1983 | WIPO . | |
| 8300759 | 3/1983 | WIPO | G06F 11/28 |

OTHER PUBLICATIONS

Albitz, Gary, "Superstate: Beyond Hardware Solutions", *Microprocessor Report*, pp. 6–5 to 6–6.
Ching, Carl, "Solutions to NS16000 Family Microprocessor Emulation Design Challenges", *IEEE*, 1983, pp. 1–14.
Christensen, Fred, "Advanced System/Software Development Tools Using System V/68, A Unix–Derived O.S. for the M68000 Family", *IEEE*, pp. 1–9.

(List continued on next page.)

*Primary Examiner*—Robert W. Beausoliel, Jr.
*Assistant Examiner*—Albert Decady
*Attorney, Agent, or Firm*—Blakely, Sokoloff, Taylor & Zafman

[57] ABSTRACT

A microprocessor is disclosed herein having an external command mode for directly accessing the execution unit, responsive to externally generated commands and instructions. An external instruction path is provided, as well as a conventional processor-driven instruction path. A multiplexer is provided that selects which of the instruction paths is actually supplied to the execution unit. Using the external command mode, the user can examine and modify registers, memory, and I/O space without otherwise affecting their contents. Any instruction executable by the execution unit is executable in the external command mode. Because direct access is provided into the execution unit, there is no implicit updating that would otherwise affect the state of the processor and require saving to an alternate memory. The present invention is implemented with a conventional test access port designed in accordance with the IEEE 1149.1 boundary scan standard, with modification to include an instruction register, a data register, and control logic. The external command mode is applicable to single and multiple pipeline processors. The circuit described herein includes several selectors for selecting between the probe mode and the processor-driven mode of operation, including an external pin, an external command, and a debug exception. For ascertaining if the circuit is in the external command mode, an acknowledge pin is provided to indicate when the execution unit is ready to accept an instruction in the probe model.

36 Claims, 5 Drawing Sheets

U.S. PATENT DOCUMENTS

| | | | |
|---|---|---|---|
| 4,312,066 | 1/1982 | Bantz et al. | 371/16.1 |
| 4,403,287 | 9/1983 | Blahut et al. | 364/200 |
| 4,404,628 | 9/1983 | Angelo | 364/200 |
| 4,422,141 | 12/1983 | Shoji | 364/200 |
| 4,455,622 | 6/1984 | Loskorn et al. | 364/900 |
| 4,547,849 | 10/1985 | Louie et al. | 364/200 |
| 4,644,494 | 2/1987 | Muller | 364/900 |
| 4,674,089 | 6/1987 | Poret et al. | 371/25 |
| 4,677,586 | 6/1987 | Magar et al. | 364/900 |
| 4,720,811 | 1/1988 | Yamaguchi et al. | |
| 4,734,882 | 3/1988 | Romagosa | 364/900 |
| 4,896,289 | 1/1990 | Svinicki et al. | 364/900 |
| 4,907,150 | 3/1990 | Arroyo et al. | 364/200 |
| 4,914,325 | 4/1990 | Yamada | 307/592 |
| 4,945,536 | 7/1990 | Hancu | 371/22.3 |
| 4,949,360 | 8/1990 | Martin | 375/106 |
| 4,967,326 | 10/1990 | May | 364/220 |
| 5,027,273 | 6/1991 | Letwin | 364/200 |
| 5,032,983 | 7/1991 | Fu et al. | 364/200 |
| 5,036,453 | 7/1991 | Renner et al. | 364/200 |
| 5,036,458 | 7/1991 | Matsushima et al. | 364/200 |
| 5,056,015 | 10/1991 | Baldwin et al. | 364/200 |
| 5,070,476 | 12/1991 | Fujiwara | 395/575 |
| 5,124,910 | 6/1992 | Koumoto et al. | 395/375 |
| 5,125,088 | 6/1992 | Culley | 395/500 |
| 5,128,970 | 7/1992 | Murphy | 375/106 |
| 5,136,714 | 8/1992 | Braudaway et al. | 395/725 |
| 5,175,853 | 12/1992 | Kardach et al. | 395/650 |
| 5,218,525 | 6/1993 | Amaski et al. | 364/140 |
| 5,222,068 | 7/1993 | Burchard | 371/22.3 |
| 5,228,039 | 7/1993 | Knoke et al. | 371/19 |
| 5,254,942 | 10/1993 | D'Souza et al. | 324/158 |
| 5,263,143 | 11/1993 | Robinson et al. | 395/425 |
| 5,265,005 | 11/1993 | Schmidt et al. | 364/147 |
| 5,274,826 | 12/1993 | Kardach et al. | 395/725 |
| 5,274,834 | 12/1993 | Kardach et al. | 395/800 |
| 5,276,824 | 1/1994 | Skruhak et al. | 395/375 |
| 5,276,888 | 1/1994 | Kardach et al. | 395/725 |
| 5,281,864 | 1/1994 | Hahn et al. | 307/272.2 |
| 5,291,604 | 3/1994 | Kardach et al. | 395/725 |
| 5,329,471 | 7/1994 | Swoboda et al. | 364/578 |
| 5,339,437 | 8/1994 | Yuen | 395/700 |
| 5,353,424 | 10/1994 | Partovi et al. | 395/425 |

OTHER PUBLICATIONS

Ellis, Simon C., "The Intel System Management Mode", *Microprocessor Report*, pp. 6–1 to 6–2.

Gephardt, Doug, et al., "System Management Mode in Am386 Microprocessors", *Microprocessor Report*, pp. 6–3 to 6–4.

Hamilton, Gail, "Evaluating Software Performance in Microprocessor Design", *IEEE*, 1983, pp. 1–5.

Handy, Jim, "Software Tools to Match Growing Microprocessor Sophistication", *IEEE*, 1983, pp. 1–5.

Marshall, John, "A Comprehensive Processor Support Strategy", *IEEE*, pp. 1–3.

Swope, William A., "Developing a Product in a Software Intensive Design", *IEEE*, pp. 1–7.

Thorson, Mark, "System Management Mode Explained", *Microprocessor Report*, pp. 6–7 to 6–10.

Vandenheede, Dr. T. M., "Advanced In–Circuit Emulation Design", *IEEE*, pp. 1–4.

Search Report dated Oct. 7, 1994.

Bursky, Dave, "Dedicated Emulation Logic on Chip Debugs Digital Processor's Hardware and Software", *Electronic Design*, May 10, 1990, pp. 29–30.

Williams, Tom, "On–Chip Test Logic Aids Emulation of Complex Processors", *Computer Design*, vol. 29, No. 19, Oct. 1, 1990, pp. 68–72.

MICROPROCESSOR WITH AN EXTERNAL COMMAND MODE FOR DIAGNOSIS AND DEBUGGING

This is a continuation of application Ser. No. 07/874,642, filed Apr. 27, 1992 now abandoned.

CROSS-REFERENCE TO RELATED APPLICATION

Cross-reference is made to the following commonly-assigned, copending patent application: "A MICROPROCESSOR HAVING A RUN/STOP PIN FOR ACCESSING AN IDLE MODE", by Robert S. Dreyer, Ser. No. 07/874,716, filed Apr. 27, 1992 now abandoned.

BACKGROUND OF THE INVENTION

1. Field of the Invention

The invention relates to computer processors, and particularly to an operational mode for diagnosing and debugging computer hardware and software.

2. Description of Related Art

A microprocessor is the heart of most modern day computers, providing a centralized location for many functions which are performed by executing a series of instructions. Microprocessors typically include a control unit that monitors and guides the functional units which together execute instructions. Specifically, the control unit monitors and controls the flow of instructions through the stages of processing. The instructions to be executed are generally stored in a computer memory element such as a Read-Only Memory (ROM), a Random Access Memory (RAM). Subject to control of the control unit, a fetching unit fetches each instruction from memory. The instructions are then decoded if necessary, and supplied to an execution unit. The execution unit may include a number of general purpose registers, an arithmetic unit (ALU), control registers, and some control logic. The data stored in the registers, which collectively represents the "processor state," often is modified during operation of the execution unit. At many different stages in the development of a computer product, it may be extremely useful to be able to examine and modify the processor state during operation, or to test the operation of the ALU and the control logic with test data. However, direct access to the execution unit is generally not practical due to factors such as cost and performance, particularly for a mass-produced microprocessor.

In addition to examining and modifying the processor state, it may be useful to examine and modify system memory and input/output (I/O) space. For example, during development of a computer, this capability would be useful to analyze interactions between the many integrated circuits, peripheral components, and the microprocessor. During development of system level software and applications programs that run on that system, the capability to obtain knowledge of the processor state may greatly facilitate debugging efforts.

In designing a computer utilizing a microprocessor, or to debug the many problems that inevitably occur during development of a computer product, an in-circuit emulator (ICE) may be used. An in-circuit emulator is a specially-designed tool that emulates the functions of the microprocessor that it is designed to support, but has additional features built in that greatly facilitate debugging efforts. In operation, an in-circuit emulator is physically placed in the socket on the printed circuit (PC) board in place of the microprocessor. In-circuit emulators implement an alternate memory space that is used to store the processor state and other relevant data for later analysis. In-circuit emulators have disadvantages, including a greater per-unit cost than the mass-produced microprocessor, an inability to detect a problem with the microprocessor itself, a greater labor cost in physically inserting the in-circuit emulator in the socket, and large expense for the associated alternate memory space, connectors, and other equipment.

To test integrated circuits on a printed circuit (PC) board, a circuit tester that may be termed a "bed of nails" has been used. The tester is clamped to the PC board, and for every wire in the package there is a pin on the tester that connects with it. After the tester is connected to each of the wires, test patterns are applied to test the circuits, and the information is stored in an alternate address space. However, with progressively smaller geometries and higher density levels, it becomes impractical to have a pin for every wire in the circuit. Furthermore, at higher speeds of operation, the signals change faster than the ability of the the tester to detect them without disturbing the system's operation. In order to address the problem of testing integrated circuits, an IEEE "boundary scan" standard was developed. In a boundary scan circuit, a simple serial connection snakes through the entire PC board for testing the circuit. Access is provided by a Test Access Port (TAP) that is a part of every chip adhering to the standard.

Problems can occur during development of a program by an applications programmer, or when the program is being integrated with the platform, or later, during execution of a program by a user. For example, the microprocessor may simply stop, it may output meaningless data, or it may destroy data in memory. Locating the cause of such a problem may be extremely difficult. In order to assist the applications programmer in his development efforts, debugging tools have been developed. The debugging tools may be built into the hardware of a computer, or they may include a software-hardware combination.

Sometimes the error is related to the software, and a software debugger may be sufficient to isolate the cause of the error. Software debuggers are assembly code programs that execute at the system level. One debugging technique involves setting breakpoints at some position in the program's code. The breakpoints halt program operation at the next convenient location and shift the program's operation into a debug mode. Because the normal flow of program operation is disrupted by a breakpoint, it is often implemented like an interrupt.

Software debuggers may provide adequate debugging in some instances, however, if the system is not operable, then the debugger program cannot operate. Furthermore, a software debugger is not useful for hardware problems, firmware problems, and timing problems. A software debugger does not operate in real time (i.e., it slows down operating program by inserting additional steps). Thus, a software debugger is not useful for timing dependent problems in which timing synchronization is important. When such a problem is encountered, a full analysis generally requires additional hardware, such as an in-circuit emulator or another hardware debugger.

If a microprocessor of an installed computer system requires troubleshooting or debugging, a service call may be required. The result of a service call is often an unhappy customer, computer downtime, unnecessary expense, and a loss of reputation. It would be an advantage to provide a microprocessor that can be diagnosed from a remote location.

It would be a further advantage to provide a microprocessor with a circuit that, using instructions supplied from an external signal, can probe the processor state, and execute instructions without affecting that state. It would be an additional advantage if the circuit utilizes hardware and pins already on-chip so that the cost of implementing the circuit is low and therefore its inclusion in mass-produced microprocessors supplied to the consumer would be cost-effective. Such a microprocessor would have application for computer designers, manufacturers, systems programmers, application programmers, and service personnel who service the consumer.

SUMMARY OF THE INVENTION

The present invention provides an external command mode for directly accessing the processor state and the execution unit, responsive to externally generated commands and instructions. Advantages of the external command mode include testability of the microprocessor. Also, the external command mode provides a way to monitor the operation of the microprocessor. A system designer or maintenance engineer can examine and modify the processor state without otherwise affecting the contents of the registers including registers that would be visible only to a supervisory level program or a privileged program. In the preferred embodiment, all registers and counters can be accessed. The user can also examine and modify the contents of memory and I/O spaces. Commands are provided to access the floating point unit and any other parallel processing unit. Also, any instruction executable by the execution unit can be executed through the external command mode.

The external command mode provides a direct access into the execution unit, and avoids implicit updating that would otherwise affect the state of the processor and therefore require saving the processor state. Because the processor state is not changed, the necessity of saving the processor state to an alternate memory is obviated. Another advantage is utilization of conventional circuits, with small modifications, that are already on the chip for another purpose, and using a standard communications protocol that can be implemented with off-the-shelf components. In the preferred embodiment, external commands and instructions are provided through a standard Test Access Port (TAP) designed in accordance with the IEEE 1149.1 boundary scan standard, and uses the Joint Test Access Group (JTAG) protocol for communications. Use of this port means that no additional pins are needed to implement the probe mode, thereby saving costs. The external command mode is applicable to pipelined processors, and to processors that have multiple pipelines operating in parallel.

The present invention is embodied in a computer circuit that operates in one of at least two modes. In a processor-driven mode, which is a conventional mode of computer operation, the circuit is responsive to a series of instructions stored in the computer memory. In the external command mode, termed the "probe mode" in the preferred embodiment, the circuit is responsive to externally generated commands and instructions that flow through an access port. The computer circuit includes a mode selection unit for selecting between the probe mode and the processor-driven mode of operation. In the preferred embodiment, three methods of selecting the external command mode are provided. A first method is through an external pin, termed a "Run/Stop" (R/S) pin that is provided on the microprocessor. A second method is by an external command through the access port. A third method is through a debug exception that might otherwise be handled by a software debug handler. For convenience in ascertaining if the circuit is in the external command mode, an additional pin, termed an "acknowledge pin", is provided to indicate when the execution unit is ready to accept an external signal.

The computer circuit includes a processor-driven instruction path, an external instruction path, and an execution unit. The processor-driven instruction path fetches instructions stored in computer's memory, and supplies them under the processor's control to the execution unit. The external instruction path provides externally generated instructions to the execution unit under external control. Which instruction is actually supplied to the execution unit is selected by a multiplexer subject to a central control unit that is responsive to the mode selection unit. In other words, each path provides an input to a multiplexer that selects which of the instruction paths is actually supplied to the execution unit.

The processor-driven instruction path implicitly updates processor state information before it provides its instruction to the execution unit. Processor state information includes the instruction pointer. For example, in embodiments that include a decoder and a prefetcher for variable length instructions, implicit behavior for the processor-driven path also includes fetching a next instruction, calculating its length, and adjusting the instruction pointer accordingly. The external instruction path does not implicitly update state information before providing its instruction to the execution unit. For example, in embodiments that include a decoder, that implicit behavior is avoided in the external command mode by bypassing the decoder and providing the instruction directly to the execution unit.

The processor-driven instruction path includes an instruction register, termed a probe instruction register (PIR), for loading and holding an instruction that is to be read by the execution unit. An access port handles the flow of information between an external signal source and the instruction register. Also provided is a data register, termed a probe data register (PDR), that can be loaded or read by the access port, or can be loaded or read by the execution unit as specified by the instruction in the instruction register.

DETAILED DESCRIPTION OF THE PREFERRED EMBODIMENT

The invention is best understood by reference to the Figures wherein like parts are designated with like numerals throughout.

Figure 1:
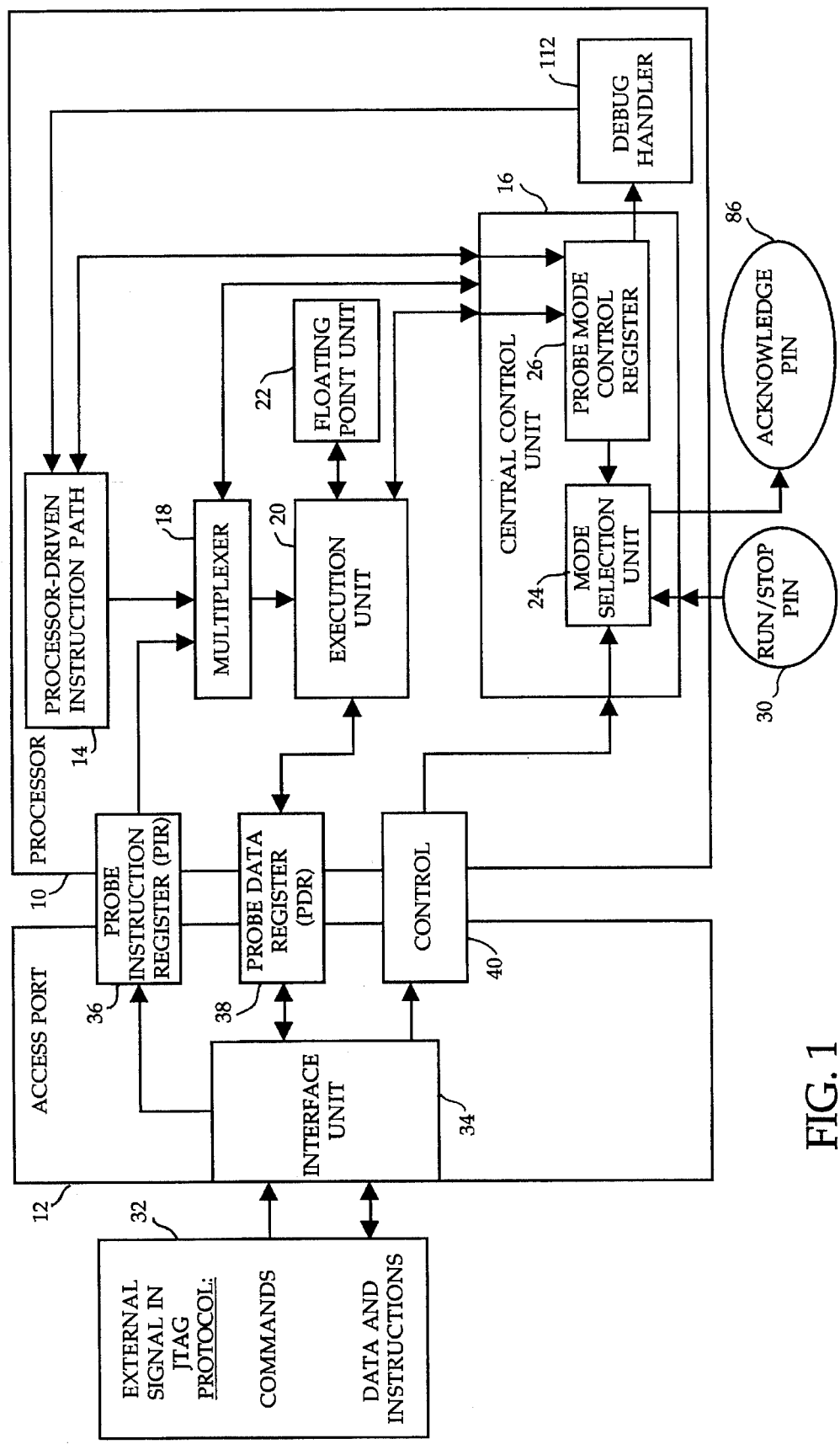
FIG. 1 is a block diagram illustrating the structure of an access port and a processor, and their interface.

Reference is made to FIG. 1 which is a block diagram illustrating a processor unit 10 and an access port 12. In the preferred embodiment, these structures, the processor unit 10 and the access port 12 are included in a single semiconductor chip package. In other embodiments the functions described therein may be performed by equivalent units in separate chips.

The processor 10 includes a processor-driven instruction path 14. Included in this processor-driven instruction path 14 are configurations for supplying instructions to an execution unit. These configurations may comprise any of a number of conventional configurations. The processor-driven instruction path 14 may include units for caching instructions, fetching these instructions, buffering them, decoding them if necessary, and buffering instructions for execution. Within the processor-driven instruction path 14 are components which are conventionally controlled by a central control unit 16. In order to perform its functions, the central control unit 16 includes conventional control logic necessary to monitor and control the operations of the processor 10, including the processor-driven instruction path 14. An instruction provided by the processor-driven instruction path 14 is provided to a multiplexer 18 which in turn supplies an instruction to an execution unit 20. The execution unit 20 may include a number of general purpose registers, an arithmetic unit (ALU), control registers, and some control logic. The execution unit 20 can access a memory 21. A co-processor, such as a floating point unit 22, may be connected to the execution unit 20 in order to provide additional functions beyond that normally performed in the execution unit. I/O space 23 may also be connected to the execution unit 20.

Within the central control unit 16, there is logic for mode selection, as illustrated in a mode selection unit 24. In the preferred embodiment, the probe mode may be selected by one of three methods which are described in more detail later. Briefly, one method examines the contents of the probe mode control register 26 following the occurrence of a debug exception to determine if the probe mode should be accessed or if a software debugger should be invoked. Accessing the probe mode through the probe mode control register 26 is described more fully with reference to FIG. 4. Another method of selecting a mode is by assertion of a run/stop pin 30 that is provided externally on the microprocessor chip. When the run/stop pin 30 is asserted, the central control unit 16 stops operation of the processor 10 on an instruction boundary. Briefly, when the run/stop pin 30 is asserted, operation of the processor 10 is halted on the next instruction boundary. An "instruction boundary" is viewed from the standpoint of the execution unit. An instruction boundary may be defined as the point between instructions when the execution unit has completed all its modifications of registers, flags, and memory for a first instruction, but before it begins modification of the registers, flags, and memory for the next instruction following in the pipeline. When the processor is halted thereby, the execution unit 20 remains available to perform operations, however the processor-driven instruction path 14 is prevented from issuing further instructions into the execution unit 20. Still another method of accessing the probe mode is through the access port 12, described below.

An external command path used in the "external command mode" is provided through the access port 12. An external signal 32 provides commands, and data and instructions to an interface unit 34 within the access port 12. The external signal 32 is provided by an external control unit, such as a hardware debugger, an in-circuit emulator, a control unit connected to a diagnostics processor, or a circuit board tester during manufacturing. The interface unit 34 is connected to a probe instruction register (PIR) 36, and a probe data register (PDR) 38. The interface unit 34 includes control logic 40 which is connected to the central control unit 16. For purposes of definition, a "command" is an order to the access port 12 which performs a function or issues a command, such as to execute an instruction in the probe instruction register 36, interrupt operation of the processor 10, or select the external command mode. An "instruction" or "microinstruction" is an instruction stored in the probe instruction register 36 that is to be executed in the execution unit 20.

The probe instruction register (PIR) 36 is connected to an input of the multiplexer 18. When the processor has entered the external command mode, the central control unit 16 controls the multiplexer 18 so that the contents of the probe instruction register 36 are supplied to the execution unit 20. The probe data register 38 is also connected to the execution unit 20, which may read its contents, or store data therein. The probe data register 38 is utilized for transfer of data to and from the execution unit 20. In an operation utilizing the probe data register 38, it is loaded using the external signal 32 before beginning execution of an instruction in the probe instruction register 36. Furthermore, following execution in the execution unit 20, if data was placed into the probe data register 38 as a result of an instruction provided by the probe instruction register 36, then that data may be read out through the interface 34 at any time subsequent to storing it in the probe data register 38.

In the preferred embodiment, the access port 12 has the form of a standard test access port (TAP) designed in accordance with the IEEE 1149.1 Boundary Scan standard, and uses the Joint Test Access Group (JTAG) protocol for communications. As part of the JTAG requirements, minimum features are required for such a TAP. The IEEE specification 1149.1 specifies a mechanism for adding optional features to the TAP. For the preferred embodiment the probe instruction register 36 and the probe data register 38 are implemented as "test data registers" in accordance with adding optional features in the IEEE specification 1149.1. TAP instructions are provided to access these registers 36, 38, and to perform the control illustrated by the box 40. In summary, the access port 12 has a JTAG interface, as described in IEEE standard 1149.1, which allows data and instructions to be exchanged between the access port 12 and an external signal 32. In accordance with the IEEE standard 1149.1 five pins (not shown) provide a serial interface between the external signal 32 and the processor 10. These pins include the test data in (TDI) pin and the test data out (TDO) pin. The TDI pin is used shift data or instructions into the access port 12 in a serial manner. The TDO pin shifts out the response data. The test mode select (TMS) pin is used to control the state of the access port controller. The test clock (TCK) is provided through the TCK pin. Typically, inputs are sampled on the rising edge of this signal. The test-logic-reset-state pin (TRST) pin forces the access port controller into the test logic reset state. For further information, refer to the IEEE standard 1149.1.

The access port 12 implements a command "WRITE PIR" which is used to build up a microinstruction for delivery to the execution unit 20. The access port 12 also implements a command "SUBMIT PIR" to indicate that the probe instruction register 36 contains a valid microinstruction and that execution should begin within the execution unit 20. The contents of the probe instruction register 36 are written only through the access port 12, and are not writable by the execution unit 20. Microinstructions may be re-submitted, for purposes such as repetitive operations such as reading or writing blocks of memory. It is not necessary to re-write the probe instruction register 36 when re-submitting an instruction to the execution unit 20.

Figure 2:
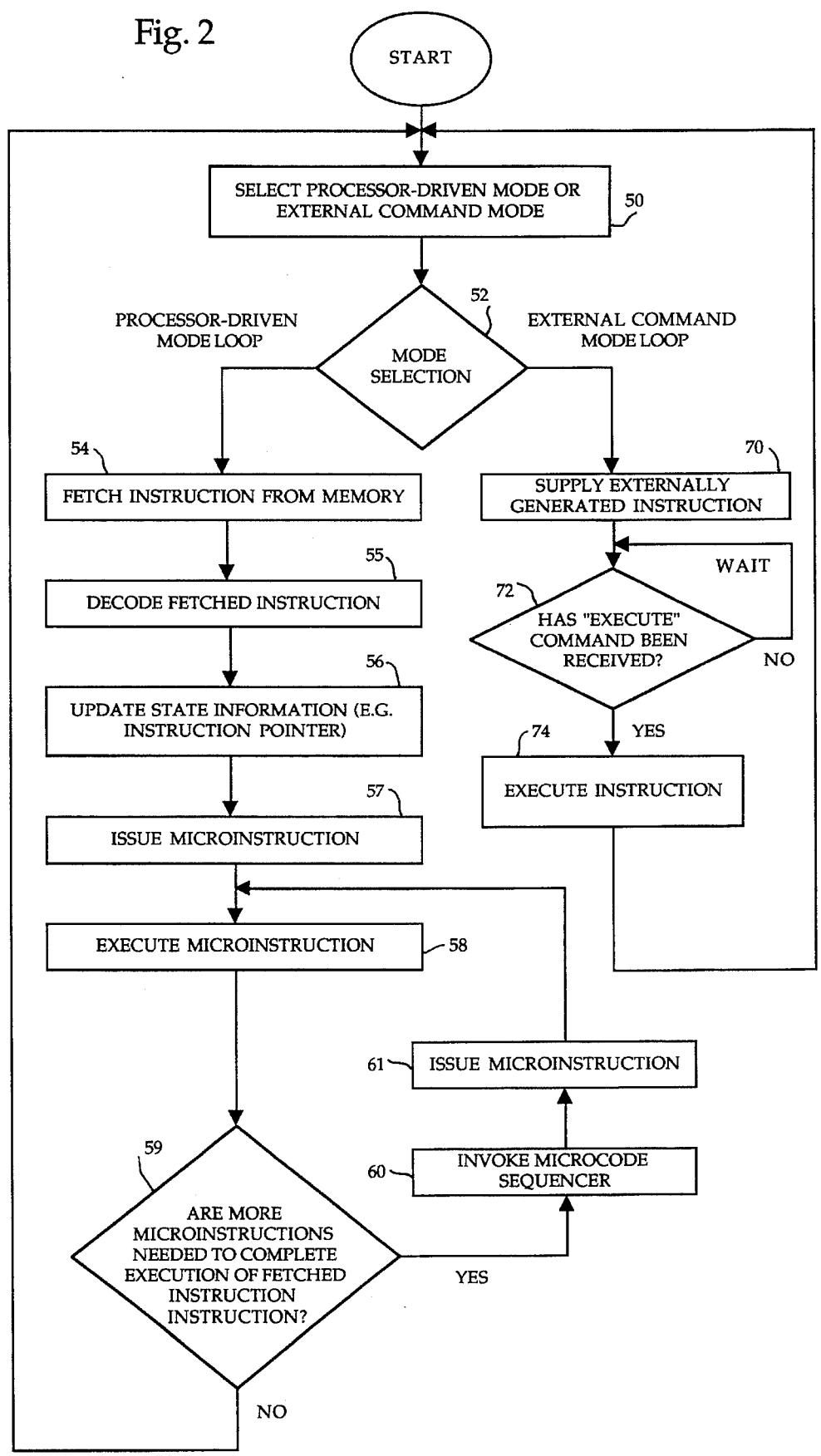
FIG. 2 is a flow chart that show steps occurring in the processor-driven mode and steps occurring in the external command mode.

Reference is now made to FIG. 2 which is a flow chart that shows a sequence of steps that occurs if the processor-driven mode is selected, and also shows a sequence of steps that occurs if the external command mode is selected. Beginning at the start box on the top of the flow chart of FIG. 2, a selection is made, as illustrated in a box 50, to select the processor-driven mode or the external command mode. Based on the selection a decision is made as shown in a decision box 52. If a processor-driven mode is selected, an instruction is fetched from memory, as illustrated in a box 54. The instruction is decoded, as illustrated in a box 55. Next, the state information such as the instruction pointer is implicitly updated in the processor 10, as illustrated in an operation box 56. A microinstruction is then issued, as illustrated in a box 57. This microinstruction is executed as illustrated in a box 58. In a decision box 59, a determination is made as to whether or not more microinstructions are needed to complete execution of the fetched instruction. If more microinstructions are needed, then a microcode sequencer will be invoked, as illustrated in an operation box 60. The microcode sequencer issues a next microinstruction as illustrated in a box 61, and then returns to the loop to execute the microinstruction as illustrated in the box 58. In some processors, the fetched instruction may require many microinstructions to be issued before execution is complete. In other processors, such as RISC processors, the fetched instruction is decoded minimally before it is supplied to the execution unit 20.

The processor's operation from fetching through decoding and updating state information may be illustrated by the following example. In this example, an undecoded instruction of variable length is fetched from memory in the box 54. Due to an assumption of this example, decoding will be necessary. The length of the instruction is ascertained, and the instruction is decoded. Based on the length of the instruction, state information (e.g., the instruction pointer) is updated to the length of the instruction.

Returning to FIG. 2, after no further microinstructions are needed, execution of the fetched instruction is finished. To complete the processor-driven loop, operation exits from the decision box 59 and returns to the place before the selection box 50 in which the processor-driven mode or the external command mode is selected. In operation, the processor-driven mode loop will typically be executed many, many times before a selection is made to go to the external command mode. Selection of a mode as illustrated in the box 50 is described in more detail with reference to FIG. 4, and later in the specification.

If instead of the processor-driven mode, the external command mode is selected, then an externally generated instruction may be supplied as illustrated in an operation box 70. Then, as illustrated in a decision box 72, the processor waits for the execute command, and when it is received, then the instruction is executed as illustrated in an operation box 74. Following execution, to complete the external command loop, operation returns to the operation box 50 in which a selection can be made between the processor-driven mode and the external command mode. Following through the external command loop again, if the external command mode has been selected, then the processor waits until an externally generated instruction has been supplied, the execute command has been received as illustrated in the decision box 72, and the instruction is executed as illustrated in an operation box 74. Operation of the external command mode is illustrated more specifically with reference to FIG. 3 below. In the preferred embodiment, the external command mode is termed the "probe mode" because it can be used to probe the computer system including the execution unit, its registers, memory, and the floating point unit.

Figure 3:
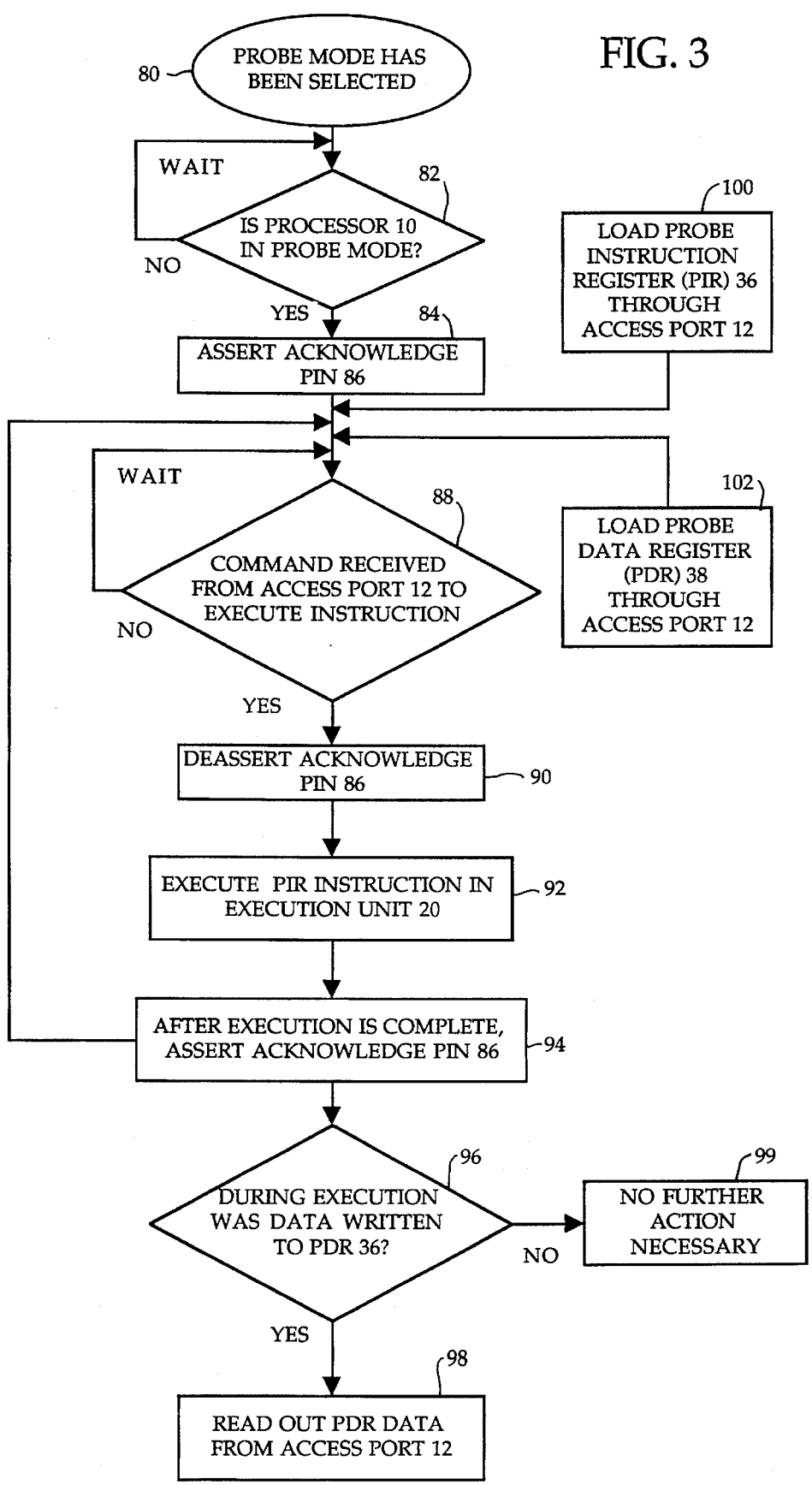
FIG. 3 is a flow chart detailing steps occurring in the probe mode of the preferred embodiment.

Reference is now made to FIG. 3, which is a flow chart illustrating operation of an external command mode, termed the "probe mode", in the preferred embodiment. The box 80 illustrates that the probe mode has been selected. Following selection of the probe mode, there is a finite time before the processor is actually in the probe mode and ready to execute a probe mode instruction. As illustrated in a decision box 82, the processor 10 waits until it is in the probe mode before proceeding. In the preferred embodiment, the processor 10 waits until the currently executing instruction has completed all modification of registers. In the next operation, as illustrated in a box 84, an acknowledge pin 86 is asserted. Reference is briefly made to FIG. 1 which shows the acknowledge pin 86. From the flow chart of FIG. 3, if should be apparent that the acknowledge pin 86 is asserted to indicate that the processor 10 is in the probe mode and ready to execute instructions. Next, as illustrated in a decision box 88, operation waits until a command is received from the access port 12 to execute an instruction. After the command is received, the acknowledge pin 86 is deasserted to indicate that the execution unit 20 has accepted the instruction in the probe instruction register (PIR) 36 and is beginning execution of it, as illustrated in an operation box 90. Execution continues and is completed as illustrated in an operation box 92. After execution is complete, the acknowledge pin 86 is asserted, as illustrated in an operation box 94. Following that operation, the processor 10 returns to the state preceding the decision box 88.

If during execution, data was written to the probe data register (PDR) 38, then an additional step may be performed by the operator to read out the data through the access port 12. As illustrated in a decision box 96, if data was written to the PDR 38 during execution, then a next step may be reading out PDR data from the access port 12 as illustrated in an operation box 98. However, if no data was written to the PDR 38 during execution then no further action is necessary, as illustrated in a box 99.

Reference is made to the upper right hand side of FIG. 3, where two operation boxes illustrate information flowing into the registers 36, 38. In an operation box 100, the probe instruction register 36 is loaded through the access port 12. In an operation box 102, the probe data register 38 is loaded through the access port 12. As shown in FIG. 3, this information is preferably provided before the decision box 88 in which an execute command is received. However, it may be noted that the operations in the boxes 100, 102 are not tied to any specific occurrence in the other portion of the flow chart. In operation of the preferred embodiment, loading the probe instruction register 36 and the probe data register 38 are accomplished independently of the remaining operations. Therefore, from the perspective of a user of the probe mode it is useful that the user be aware of whether or not a legitimate instruction is actually in the probe instruction register 36 before issuing a command to execute the instruction and that the processor 10 is ready to accept a command, as indicated by the acknowledge pin 86. Furthermore, if data is required to execute the command, the user must ensure that legitimate data is provided in the probe data register 38 before commencing execution of the instruction.

The mechanism for selecting the probe mode will now be discussed. With reference to the preceding discussion, it has been stated with reference to FIG. 1 that mode selection occurs in the central control unit 16 in the mode selection box 24. With reference to FIG. 2, it has been discussed that a selection is made between the processor-driven mode and the external command mode in an operation box 50. In FIG. 3, it was assumed in the box 80 that the probe mode has been selected. In the preferred embodiment, selection of the probe mode may be accomplished in one of three methods: a first method is by a command issued through the access port 12, a second method is through a debug mechanism provided in either the processor-driven instruction path 14 or the execution unit 20, and a third method uses the run/stop pin 30.

For the first and the third methods in the preferred embodiment, the transition into the probe mode has common characteristics. Within the mode selection unit 24, an interrupt prioritizer may be provided, which monitors and controls interrupting the processor 10. The first and the third methods operate through the interrupt prioritizer. In the preferred embodiment, these methods assert a high level interrupt in the interrupt prioritizer that halts the operation of the processor-driven instruction path on the next instruction boundary, and selects an input in the multiplexer 18 so that an instruction path is provided from the probe instruction register 36. Furthermore, after selection of the probe mode has been completed, the acknowledge pin 86 is asserted to indicate that the execution unit 20 is ready to receive probe mode instructions.

In the first method of accessing the idle mode, a command in the external signal 32 is sent through the interface 34. Control logic 40 determines if the command is issued to access the probe mode. If so, it provides a signal to the mode selection unit 24 within the central control unit 16. Alternatively, the run/stop pin 30 provides a similar signal to the mode selection unit 24.

Figure 4:
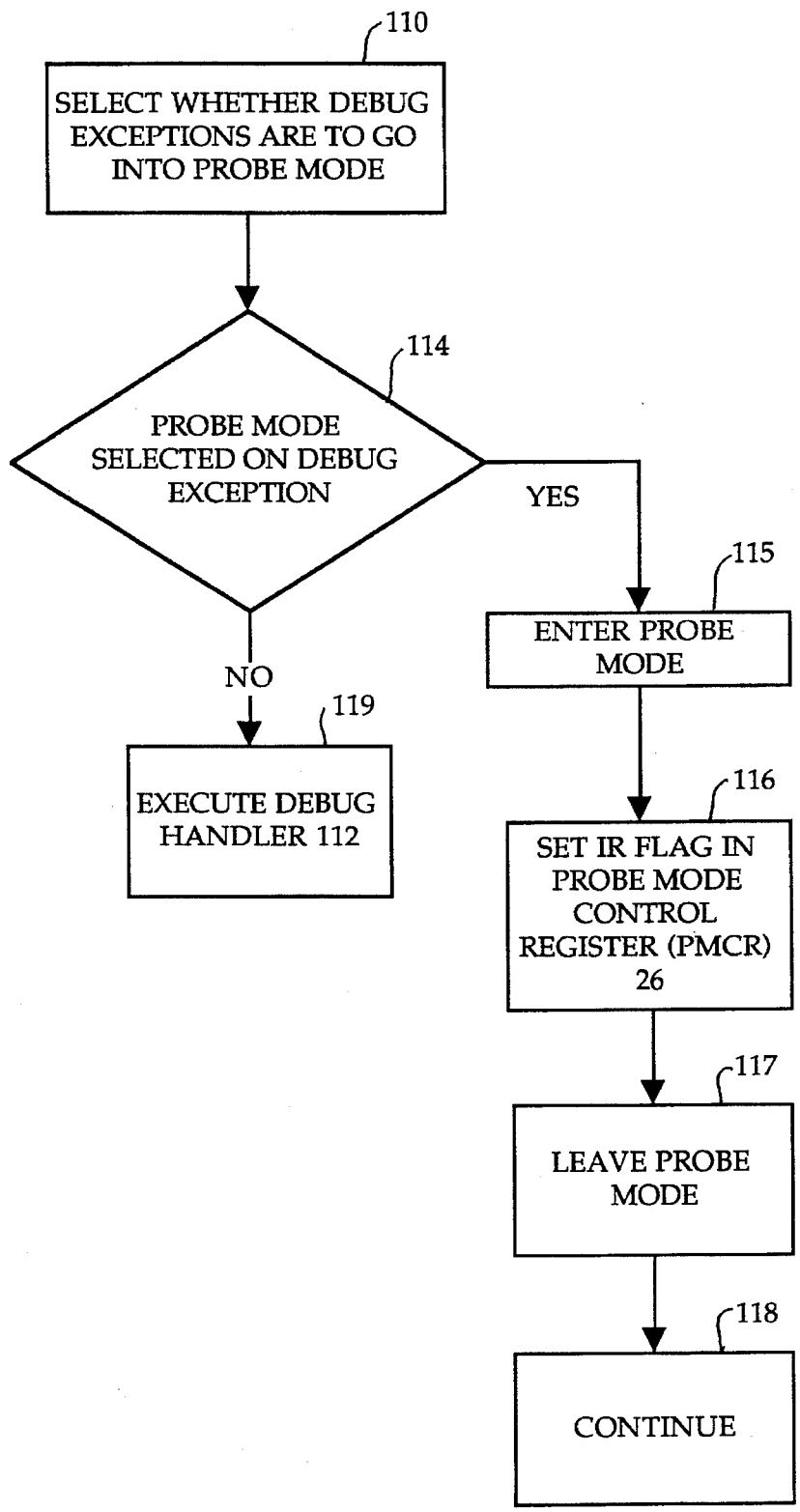
FIG. 4 is a flow chart illustrating selection of the probe mode for handling a debug exception.
Figure 5:
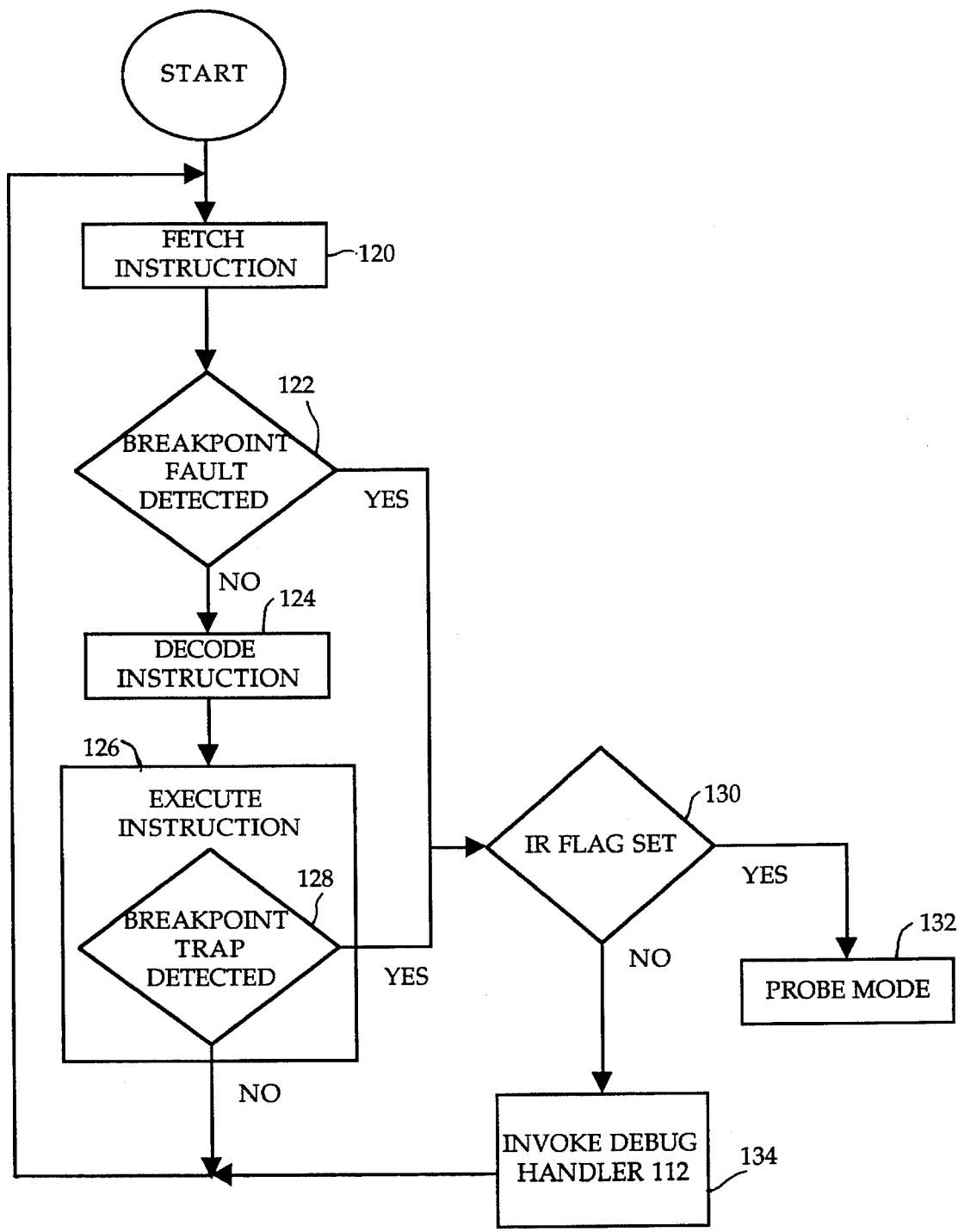
FIG. 5 is a flow chart illustrating a method of accessing the probe mode by a debug exception.

Reference is made to FIGS. 4 and 5, which are flow charts illustrating accessing the probe mode through a debug exception in the preferred embodiment. The box 110 illustrates a selection, which is made by a user prior to beginning a debug session, for example, as to whether debug exceptions will invoke the probe mode, or whether debug exceptions invoke a debug handler 112 (FIG. 1). In the preferred embodiment, a Probe Mode Control Register (PMCR) is part of the processor state that can be modified within the probe mode by an instruction. This control register includes a single bit flag, the Interrupt Redirect (IR) flag, that is tested when breakpoint exceptions are detected, as described in further detail below. Next a decision is made as illustrated in a decision box 114 based on whether or not the probe mode has been selected. If the probe mode was selected then the probe mode is entered, as illustrated in a box 115. Next, an instruction is issued through the access port 12 to set the IR flag in the probe mode control register (PMCR) 26, as illustrated in an operation box 116. Subsequently, the processor leaves the probe mode, as illustrated in an operation box 117, and operation continues in a box 118. Returning to the decision 114, if the probe mode was not selected, then the debug handler 112 executes.

Reference is made to the flow chart of FIG. 5, where a "start" illustrates beginning operation of the processor 10. Following start, an instruction is fetched as illustrated in a box 120. If a breakpoint fault is not detected, as illustrated in a decision box 122, then the instruction is decoded as illustrated in an operation box 124. Detection of the breakpoint may occur before or coincidentally with decoding in the box 124. Next, the instruction is executed as illustrated in an operation box 126. A "fault" breakpoint is defined as an exception serviced before execution of an instruction. A "trap" breakpoint is defined as an exception serviced following completion of the instruction that generated the exception. Within the execute instruction box 126, if a breakpoint trap is not detected as illustrated in a decision box 128, then the loop is repeated, beginning with fetching the instruction in the box 120, decoding the instruction in the box 124 and so forth through the loop.

If the breakpoint fault is detected in the decision box 122 subsequent to decoding, or if a breakpoint trap is detected in the execution in the box 126, then the IR flag in the probe mode control register 26 is checked to see whether or not it is set, as illustrated in a decision box 130. If the IR flag is set then the processor enters the probe mode as illustrated in a box 132 without executing additional instructions. However, if the IR flag is not set, then the breakpoint is handled through the debug handler, as illustrated in operation box 134. The debug handler operation illustrated in the operation box 134 is a conventional way of handling debugging and breakpoints.

To exit the probe mode, two methods have been implemented. In one method, the run/stop pin 30 (FIG. 1) may simply be deasserted, for example by pulling it to a low voltage if it is "active high". In another method, a command is issued from the control logic 40 which directs the mode selection unit 24 to select the processor-driven mode. However, this command will have no effect if the run/stop pin 30 is asserted. In other words, as implemented, assertion of the run/stop pin 30 overrides an external command through the access port 12.

The format of the probe mode instruction will be discussed below. As discussed above, a probe mode instruction to be executed in the execution unit 20 is first stored in the probe instruction register (PIR) 36. This instruction is then provided directly through the multiplexer 18 to the execution unit 20. Therefore, the format of the instruction within the probe instruction register 36 must be such that it is executable by the execution unit 20. In order for an instruction to be recognizable by the execution unit 20, it must have a format that is a subset of the instructions that are executable within the execution unit 20. Due to the wide variety of instructions in different computer architectures, no particular form of instruction or instruction subset is required by the present invention for an instruction provided through the probe instruction register 36. Generally, the instructions will be simple load store instructions for probing the state of the processor 10, particularly the registers within the execution unit 20. However, more complex operations are executable, and in fact any instruction recognizable within the execution unit 20 may be performed therein. Such operations include access to secondary memory, access to peripheral components, and arithmetic operations within the execution unit 20. The instructions implemented in the preferred embodiment are described below. However, the present invention is not limited to the particular microinstructions described. In the probe mode of the preferred embodiment, the microprocessor can accept simple load-store instructions. The instructions are a subset of the microcode executable within the execution unit 20, and as described above, bypass the processor-driven instruction path 14. Probe mode instructions allow all programmer visible registers to be read and written. In addition, memory and I/O (input/output) spaces may be accessed. In the probe mode, external interrupts remain pending and are not serviced until the probe mode is exited. Other operations that may asynchronously occur during execution, such as snooping and writebacks, will normally occur during probe mode.

As discussed above, the probe instruction register 36 holds an instruction. In the preferred embodiment, the probe instruction register 36 is a fixed format instruction word which contains fields for "opcodes", source and destination registers, and immediate data. The probe data register 38 is used to exchange data values with the execution unit 20. For example, to read a register within the execution unit 20, an instruction would issue from the probe instruction register 36 that writes the desired register to the probe data register 38, and then the probe data register 38 is scanned out through the access port 12. In a similar manner, memory, whether it be main memory or secondary memory, may be examined by issuing an instruction to read from memory into a temporary register within the execution unit 20, and then reading this temporary register to the probe data register 38. Another register is the probe control register described above.

The invention has been implemented in a processor that has two pipelines, a "u" pipeline and a "v" pipeline. The instruction executed in the probe mode, which may be termed a "microinstruction" has full control of both the u- and v-pipelines.

The probe instruction register includes two major fields, one to control the integer u-pipe and an almost identical field to control the integer v-pipe. The u-pipe field also may be used to access the floating point processor state. If there is an architectural state that is preserved across instruction boundaries, it is useful that it be accessible through probe mode. For example, the 80×86 has, in addition to the general purpose registers, floating point registers, and segment registers. The present invention provides a circuit and method to access these registers through probe mode.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

What is claimed is:

1. A computer circuit for operating in a processor-driven mode responsive to a series of stored macroinstructions from a computer memory, and also for operating in an external command mode responsive to an externally supplied microinstruction and an externally supplied command, comprising:

a mode selection unit for selecting the external command mode or the processor-driven mode;

an execution unit for executing microinstructions;

a microinstruction multiplexer for providing a selected microinstruction to the execution unit;

a processor-driven instruction path including a decoder for receiving and decoding said stored macroinstructions and decoding them into microinstructions which are then supplied to a first input of the microinstruction multiplexer;

an external instruction path for supplying an externally supplied microinstruction to a second input of the microinstruction multiplexer; and a control circuit responsive to the mode selection unit for controlling the microinstruction multiplexer to select during processor-driven operation, a microinstruction resulting from a decoded macroinstruction from the processor-driven instruction path, and during external command mode operation, an externally supplied microinstruction from the external instruction path.

2. The computer circuit of claim 1 wherein the processor-driven instruction path comprises a decoder that updates the macroinstruction pointer coincident with decoding a macroinstruction.

3. The computer circuit of claim 1 wherein the external instruction path comprises an instruction register coupled to the microinstruction multiplexer, said instruction register for storing an externally supplied microinstruction.

4. The computer circuit of claim 1 wherein the mode selection unit includes a run/stop pin that, when asserted, halts operation of the processor-driven instruction path.

5. The computer circuit of claim 1 wherein the mode selection unit includes control logic, responsive to an externally supplied command, for halting operation of the processor-driven instruction path.

6. The computer circuit of claim 1 wherein the mode selection unit includes a probe mode control register that includes an instruction redirect (IR) flag for halting operation of the processor-driven instruction path when a debug exception is encountered during operation of the processor-driven instruction path.

7. The computer circuit of claim 1 further comprising an acknowledge pin that provides a signal indicative of whether the processor is in the external command mode and ready to execute an externally supplied microinstruction.

8. A computer circuit including a processor, said circuit operating in a processor-driven mode wherein the circuit executes a series of macroinstructions stored in a computer memory, and also for operating in a probe mode wherein the circuit receives an external signal that may include externally supplied commands, and externally supplied probe mode microinstructions, said circuit comprising:

a mode selection unit for selecting between the processor-driven mode and the probe mode;

an access port, including
      means for receiving and sending the external signal,
      means for sending information to the processor and receiving information from the processor, and
      control logic for controlling the interface between the port and the processor;

a probe instruction register for holding a probe mode microinstruction received in the external signal;

a probe data register for holding data;

an execution unit for executing microinstructions; and a microinstruction multiplexer coupled to the mode selection unit that selects a microinstruction to be provided to the execution unit, said microinstruction multiplexer selecting one of inputs including an input microinstruction decoded from a macroinstruction from the processor-driven path and an input probe mode microinstruction from the probe instruction register.

9. The computer circuit of claim 8 further comprising means, responsive to an externally supplied command, for initiating execution of a microinstruction in the probe instruction register.

10. The computer circuit of claim 8 wherein the mode selection unit includes a run/stop pin that, when asserted, halts operation of the processor-driven instruction path.

11. The computer circuit of claim 8 wherein the mode selection unit includes control logic, responsive to an externally supplied command, for halting operation of the processor-driven instruction path.

12. The computer circuit of claim 8 wherein the mode selection unit includes a probe mode control register that includes an instruction redirect flag for halting operation of the processor-driven instruction path when a debug exception is encountered during operation in the processor-driven mode.

13. The computer circuit of claim 8 further comprising an acknowledge pin that provides a signal indicative of whether the processor is in the probe mode and ready to execute a microinstruction in the probe instruction register.

14. A microprocessor for selectively operating in a processor-driven mode wherein the microprocessor is responsive to a series of macroinstructions stored in a computer memory, and for operating in an external command mode wherein the microprocessor is responsive to externally supplied microinstructions, said microprocessor comprising:

means for selecting between the external command mode and the processor-driven mode;

a decoder for receiving and decoding stored macroinstructions;

an execution unit for executing microinstructions;

means for supplying an externally supplied microinstruction to the execution unit directly, thereby bypassing the decoder when the external command mode is selected; and means for supplying one or more microinstructions from a decoded macroinstruction from the decoder to the execution unit when the processor-driven mode is selected;

updating means for implicitly updating the processor state information before supplying said decoded microinstruction to the execution unit when said processor-driven mode is selected, said processor state information including an instruction pointer; and means for bypassing said updating means when the external command mode is selected.

15. The microprocessor of claim 14 wherein the means for executing a stored macroinstruction in the processor driven path further comprises a decoder that updates the instruction pointer before supplying the microinstructions resulting from the decoded macroinstruction to the execution unit.

16. The microprocessor of claim 14 wherein the means for supplying an externally supplied microinstruction to the execution unit includes an instruction register for storing an externally supplied microinstruction.

17. The microprocessor of claim 14 further comprising an acknowledge pin that provides a signal indicative of whether the processor is in the external command mode and ready to execute an externally supplied microinstruction.

18. An external command method of operating a microprocessor having a pipelined instruction flow through a processor-driven instruction path that implicitly updates state information, including the instruction pointer, before supplying a microinstruction to an execution unit, said external command method comprising the steps of:

providing an external instruction path coupling an external signal with the execution unit, said external instruction path bypassing the implicit updating of the processor-driven instruction path which would otherwise result from decoding a stored macroinstruction;

supplying a microinstruction through the external instruction path for execution in the execution unit, bypassing the macroinstruction decoder in the processor-driven instruction path; and executing said microinstruction in the execution unit.

19. The method of claim 18 wherein the external instruction path includes an instruction register;

the step of supplying the microinstruction through the external command path includes storing the microinstruction in the instruction register; and the step of executing the microinstruction in the execution unit comprises reading the instruction register.

20. The method of claim 18 further comprising the steps of:

providing an external data path coupling the external signal with the execution unit, said external data path including a data register that can be written or read subject to the control of an external signal;

if said microinstruction instructs reading the processor state or other data from the execution unit, then storing that data in said data register and reading out the data utilizing the external signal; and if said microinstruction instructs writing data to the execution unit, then using the external signal to store data in the data register and then reading the data register by the execution unit.

21. The method of claim 18 further comprising a step of initiating said execution step by supplying an externally supplied command to a control unit.

22. A method of operating a microprocessor including a decoder and an execution unit, comprising the steps of:

selecting a mode of executing microinstructions, said modes including a probe mode method of executing microinstructions supplied by the external path and a processor-driven mode method of executing microinstructions which resulted from the decoding of macroinstructions stored in memory;

if the processor-driven mode has been selected, then executing microinstructions comprises the steps of
    fetching a macroinstruction from memory and providing it to a decoder,
    decoding the macroinstruction to provide one or more microinstructions that are applied, one after the other, to an execution unit,
    updating processor state information including an instruction pointer, and
    executing microinstructions supplied from the decoder; and if the probe mode has been selected, then executing microinstructions comprises the steps of
    providing an externally supplied microinstruction to the execution unit, thereby bypassing the decoder and not updating the instruction pointer and other processor state information, and
    executing the externally supplied microinstruction.

23. The method of claim 22 further comprising a step of asserting an acknowledge pin to indicate when the probe mode has been selected and the processor is ready to execute an externally supplied microinstruction.

24. The method of claim 22 wherein if the probe mode has been selected, then executing externally supplied microinstructions further comprises the steps of:

storing an externally supplied microinstruction in an instruction register; and reading the instruction register to execute said stored externally supplied microinstruction.

25. The method of claim 22 further comprising the steps of:

if said externally supplied microinstruction instructs reading data from the execution unit, then storing that data in a data register and reading out the data from the data register.

26. The method of claim 22 wherein:

if said externally supplied microinstruction instructs writing data to the execution unit, then the method further comprises the steps of storing data in the data register and then reading said data in the data register into the execution unit.

27. The method of claim 22 further comprising a step of initiating said step of executing the externally supplied microinstruction by supplying an externally supplied command to a control unit.

28. The method of claim 22 wherein the step of selecting a mode of operation includes the steps of asserting an external pin, and controlling the processor-driven instruction path so that the fetching, decoding, and updating steps of the processor-driven mode are halted.

29. The method of claim 22 wherein the step of selecting a mode of operation includes the step of applying a signal to control logic that halts the fetching, decoding, and updating operations of the processor-driven mode of operation.

30. The method of claim 22 wherein the step of selecting a mode of operation includes the steps of:

setting an interrupt redirect flag in a probe mode control register;

during operation in the processor-driven mode, detecting a debug exception;

testing the interrupt redirect flag to determine if it has been set;

if the interrupt redirect flag has been set, then selecting the probe mode with control logic that halts the fetching, decoding, and updating operations of the processor-driven mode of operation.

31. A computer circuit including a processor operating in one of a processor-driven mode in which the circuit executes a series of macroinstructions stored in a computer memory and a probe mode wherein the processor receives and processes an external signal, said circuit comprising:

an external control unit that provides said external signal including an externally supplied command and probe mode instruction;

an access port coupled to said external control unit, including a circuit for receiving and sending the external signal;

a circuit for sending information to the processor and receiving information from the processor;

control logic for controlling the interface between the access port and the processor, and a probe instruction register for holding a probe mode microinstruction received in the external signal;

an execution unit for executing microinstructions;

a mode selection unit for selecting between the processor-driven mode and the probe mode; and a microinstruction multiplexer that selects a microinstruction to be provided to the execution unit, said microinstruction multiplexer having inputs including a microinstruction decoded from a macroinstruction from the processor-driven path and a probe mode microinstruction from the probe instruction register, said microinstruction multiplexer coupled to the mode selection unit to select one of said inputs.

32. The computer circuit of claim 31 further comprising a probe data register for holding data coupled between said access port and said processor.

33. The computer circuit of claim 31 wherein the mode selection unit includes a run/stop pin that, when asserted, halts operation of the processor-driven instruction path.

34. The computer circuit of claim 31 wherein the mode selection unit includes control logic, responsive to an externally supplied command, for halting operation of the processor-driven instruction path.

35. The computer circuit of claim 31 wherein the mode selection unit includes a probe mode control register that includes an instruction redirect flag for halting operation of the processor-driven instruction path when a debug exception is encountered during operation in the processor-driven mode.

36. The computer circuit of claim 31 further comprising an acknowledge pin that provides a signal indicative of whether the processor is in the probe mode and ready to execute a microinstruction in the probe instruction register.

* * * * *

UNITED STATES PATENT AND TRADEMARK OFFICE
CERTIFICATE OF CORRECTION

PATENT NO. : 5,479,652
DATED : December 26, 1995
INVENTOR(S) : Dreyer et al.

It is certified that error appears in the above-indentified patent and that said Letters Patent is hereby corrected as shown below:

In column 8 at line 20 delete "if" and insert --it--

Signed and Sealed this

Fifth Day of August, 1997

Attest:

Attesting Officer

BRUCE LEHMAN

Commissioner of Patents and Trademarks

REEXAMINATION CERTIFICATE (4072nd)

United States Patent [19]
Dreyer et al.

[11] B1 5,479,652
[45] Certificate Issued May 2, 2000

[54] MICROPROCESSOR WITH AN EXTERNAL COMMAND MODE FOR DIAGNOSIS AND DEBUGGING

[75] Inventors: Robert S. Dreyer, Sunnyvale; Donald B. Alpert, Santa Clara; Nimish H. Modi, San Jose, all of Calif.; Mike J. Tripp, Forest Grove, Oreg.

[73] Assignee: Intel Corporation, Santa Clara, Calif.

Reexamination Request:
No. 90/004,578, Mar. 7, 1997

Reexamination Certificate for:
Patent No.: 5,479,652
Issued: Dec. 26, 1995
Appl. No.: 08/327,229
Filed: Oct. 21, 1994

Certificate of Correction issued Aug. 5, 1997.

Related U.S. Application Data

[63] Continuation of application No. 07/874,642, Apr. 27, 1992, abandoned.

[51] Int. Cl.[7] .................................................. G06F 11/34
[52] U.S. Cl. ................... 714/30; 364/265.6; 364/267.91; 364/DIG. 1; 712/227; 712/43; 714/32
[58] Field of Search ................................ 714/25, 27, 28, 714/30, 31, 32, 35

[56] References Cited

U.S. PATENT DOCUMENTS

| | | |
|---|---|---|
| 4,338,662 | 7/1982 | Yokoyama . |
| 4,422,141 | 12/1983 | Shoji ........................................... 714/30 |
| 4,495,563 | 1/1985 | McDonough ...................... 395/800.42 |
| 4,507,727 | 3/1985 | Magar . |
| 4,514,805 | 4/1985 | McDonough et al. . |
| 4,530,047 | 7/1985 | Rogers et al. ........................... 395/562 |
| 4,636,945 | 1/1987 | Tanagawa et al. . |
| 4,670,838 | 6/1987 | Kawata ..................................... 714/38 |
| 5,068,783 | 11/1991 | Tanagawa et al. ......................... 714/27 |
| 5,084,814 | 1/1992 | Vaglica et al. ........................... 395/325 |
| 5,210,864 | 5/1993 | Yoshida .............................. 395/183.13 |
| 5,231,314 | 7/1993 | Andrews ................................. 327/153 |
| 5,452,423 | 9/1995 | Picard et al. ............................. 712/210 |

FOREIGN PATENT DOCUMENTS

| | | | |
|---|---|---|---|
| 2 256 733 | 12/1992 | United Kingdom | .............. G06F 9/30 |
| 2256733 | 12/1992 | United Kingdom | ............ G96F 11/00 |

*Primary Examiner*—Ly V. Hua

[57] ABSTRACT

A microprocessor is disclosed herein having an external command mode for directly accessing the execution unit, responsive to externally generated commands and instructions. An external instruction path is provided, as well as a conventional processor-driven instruction path. A multiplexer is provided that selects which of the instruction paths is actually supplied to the execution unit. Using the external command mode, the user can examine and modify registers, memory, and I/O space without otherwise affecting their contents. Any instruction executable by the execution unit is executable in the external command mode. Because direct access is provided into the execution unit, there is no implicit updating that would otherwise affect the state of the processor and require saving to an alternate memory. The present invention is implemented with a conventional test access port designed in accordance with the IEEE 1149.1 boundary scan standard, with modification to include an instruction register, a data register, and control logic. The external command mode is applicable to single and multiple pipeline processors. The circuit described herein includes several selectors for selecting between the probe mode and the processor-driven mode of operation, including an external pin, an external command, and a debug exception. For ascertaining if the circuit is in the external command mode, an acknowledge pin is provided to indicate when the execution unit is ready to accept an instruction in the probe model.

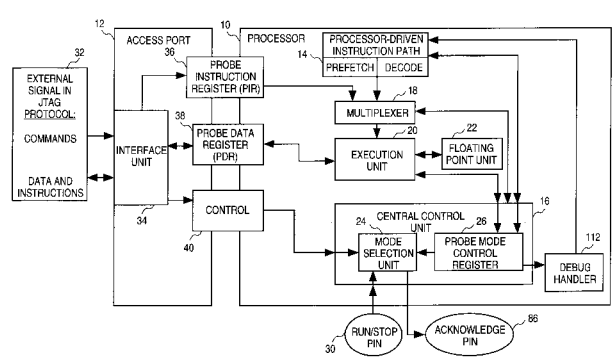

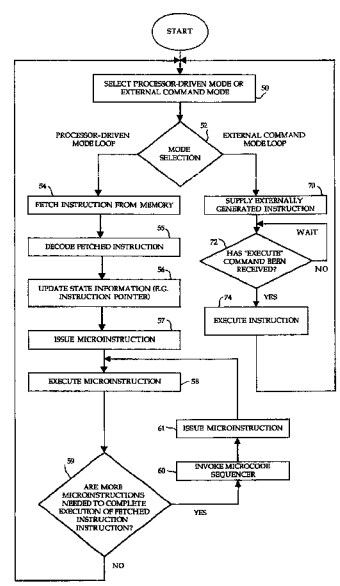

:

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

THE DRAWING FIGURES HAVE BEEN CHANGED AS FOLLOWS:

FIG. 1: Element 14 has been corrected to include a "PREFETCH" element and a "DECODE" element.

AS A RESULT OF REEXAMINATION, IT HAS BEEN DETERMINED THAT:

Claims 1, 3, 7–9, 11, 14, 18–20, 22–26 and 28–31 are determined to be patentable as amended.

Claims 2, 4–6, 10, 12, 13, 15–17, 21, 27 and 32–36, dependent on an amended claim, are determined to be patentable.

1. A computer circuit for operating in a processor-driven mode responsive to a series of stored macroinstructions from a computer memory, and also for operating in an external command mode responsive to an externally supplied microinstruction and an externally supplied command, comprising:

a mode selection unit for selecting the external command mode of operation or the processor-driven mode;

an execution unit for executing microinstructions;

a microinstruction multiplexer for providing a selected microinstruction to the execution unit;

a processor-driven instruction path including a decoder for receiving and decoding said stored macroinstructions and decoding them into microinstructions which are then supplied to a first input of the microinstruction multiplexer, *wherein the decoder contributes to an updating of state information within a processor*;

an external instruction path[, distinct from the processor driven instruction path,] for supplying [an] *the* externally supplied microinstruction to a second input of the microinstruction multiplexer; and a control cirucit responsive to the mode selection unit for controlling the multiplexer to select, during processor-driven mode operation, a microinstruction resulting from a decoded macroinstruction from the processor-driven instruction path, and, during external command mode operation, [an] *the* externally supplied microinstruction from the external instruction path.

3. The computer circuit of claim 1 wherein the external instruction path comprises an instruction register coupled to the microinstruction multiplexer, said instruction register for storing [an] *the* externally supplied microinstruction.

7. The computer circuit of claim 1 further comprising an acknowledge pin that provides a signal indicative of whether the processor is in the external command mode and ready to execute [an] *the* externally [generated] *supplied* microinstruction.

8. A computer circuit including a processor, said circuit operating in a processor-driven mode wherein the circuit executes a series of macroinstructions stored in a computer memory, and also for operating in a probe mode wherein the circuit receives an external signal that may include externally supplied commands, and *an* externally supplied probe mode microinstruction, said circuit comprising:

a mode selection unit for selecting between the processor-driven mode and the probe mode;

an access port, including;

means for receiving and sending the external signal, means for sending information to the processor and receiving information from the processor, and

*first* control logic for controlling [the] *an* interface between the *access* port and the processor *by enabling the probe mode in which the externally supplied command is sent to the processor*;

a probe instruction register for holding a probe mode microinstruction received in the external signal;

a probe data register for holding data;

an execution unit for executing microinstructions; and a microinstruction multiplexer coupled to the mode selection unit that selects a microinstruction to be provided to the execution unit, said microinstruction multiplexer selecting one of inputs including an input microinstruction decoded from a macroinstruction from [the] *a* processor-driven *instruction* path *that updates state information within the processor,* and an input probe mode microinstruction from the probe instruction register not included in the processor-driven instruction path.

9. The computer circuit of claim 8 further comprising means, responsive to [an] *the* the externally supplied command, for initiating execution of [a] *the input probe mode* microinstruction in the probe instruction register.

11. The computer circuit of claim 8 wherein the mode selection unit includes *second* control logic, responsive to an externally supplied command, for halting operation of the processor-driven instruction path.

14. A microprocessor for selectively operating in a processor-driven mode wherein the microprocessor is responsive to a series of macroinstructions stored in a computer memory, and for operating in an external command mode wherein the microprocessor is responsive to the externally supplied microinstructions, said microprocessor comprising:

means for selecting between the external command mode and the processor-driven mode;

a decoder for receiving and decoding stored macroinstructions *and for contributing to an updating of state information within the microprocessor*;

an execution unit for executing microinstructions;

means for supplying an externally supplied microinstruction to the execution unit directly, thereby bypassing the decoder when the external command mode is selected; and means for supplying one or more microinstructions from a decoded macroinstruction from the decoder to the execution unit when the processor-driven mode is selected[, the means for supplying the one or more microinstructions being distinct from the means for supplying the externally supplied microinstruction];

updating means, *associated with the decoder,* for implicitly updating the [processor] state information before supplying said decoded microinstruction to the execution unit when said processor-driven mode is selected, said processor state information including an instruction pointer; and means for bypassing said updating means when the external command mode is selected.

18. An external command method of operating a microprocessor having a pipelined instruction flow through a processor-driven instruction path that implicitly updates state information, including [the] *an* instruction pointer, before supplying a microinstruction to an execution unit, said external command method comprising the steps of:

providing an external instruction path coupling an external signal with the execution unit, said external instruction path [being distinct from the processor-driven instruction path and] bypassing the implicit updating of *the state information, by a macroinstruction decoder in* the processor-driven instruction path, which would otherwise result from [the] decoding of a stored macroinstruction *by the macroinstruction decoder*;

supplying [a] *an externally supplied* microinstruction through the external instruction path for execution in the execution unit, bypassing the macroinstruction decoder in the processor-driven instruction path; and executing [said] *the externally supplied* microinstruction in the execution unit.

19. The method of claim 18 wherein the external instruction path includes an instruction register;

the step of supplying the *externally supplied* microinstruction through the external command path includes storing the *externally supplied* microinstruction in the instruction register; and the step of executing the *externally supplied* microinstruction in the execution unit comprises reading the instruction register.

20. The method of claim 18 further comprising the steps of:

providing an external data path coupling the external signal with the execution unit, said external data path including a data register that can be written *to* or read *from* subject to the control of [an] *the* external signal;

if [said] *the externally supplied* microinstruction instructs reading the processor state or other data from the execution unit, then storing that data in said data register and reading out the data utilizing the external [signal] *data path*; and if [said] *the externally supplied* microinstruction instructs writing data to the execution unit, then using the external [signal] *data path* to store data in the data register and then reading the data register [by] *utilizing* the execution unit.

22. A method of operating a microprocessor including a decoder and an execution unit, comprising the steps of:

selecting a mode, *from a plurality of modes,* of executing micorinstructions, said *plurality of* modes including a probe mode method of executing microinstructions supplied by an external path and a processor-driven mode method of executing microinstructions which resulted from [the] decoding of macroinstructions stored in memory;

if the processor-driven mode *method* has been selected, then executing macroinstructions comprises the steps of:

fetching a macroinstruction from memory and providing it to a decoder included within a processor-driven instruction path, decoding the macroinstruction to provide one or more microinstructions that are [applied] *supplied* one after the other, to an execution unit from the processor-driven instruction path, updating processor state information including an instruction pointer, and executing *the one or more* microinstructions supplied from the decoder; and if the probe mode *method* has been selected, then executing microinstructions comprises the steps of:

providing an externally generated microinstruction to the execution unit [via an external instruction path distinct from the processor-driven instruction path,] thereby bypassing the decoder and not updating the instruction pointer and other processor state information, and executing the externally supplied microinstruction.

23. The method of claim 22 further comprising a step of asserting an acknowledge pin to indicate when the probe mode *method* has been selected and the processor is ready to execute [an] *the* externally supplied microinstruction.

24. The method of claim 22 wherein if the probe mode *method* has been selected, then executing *the* externally supplied microinstruction[s] further comprises the steps of:

storing [an] *the* externally supplied microinstruction in an instruction register; and reading the instruction register to execute [said] *the* stored externally supplied microinstruction.

25. The method of claim 22 further comprising the steps of:

if [said] *the* externally supplied microinstruction instructs reading data from the execution unit, then storing that data in a data register and reading out the data from the data register.

26. The method of claim 22 wherein:

if [said] *the* externally supplied microinstruction instructs writing data to the execution unit, then the method further comprises the steps of storing data in the data register and then reading the data register into the execution unit.

28. The method of claim 22 wherein the step of selecting a mode of operation includes the steps of asserting an external pin, and controlling the processor-driven instruction path so that the fetching, decoding, and updating steps of the processor-driven mode *method* are halted.

29. The method of claim 22 wherein the step of selecting a mode of operation includes the step of applying a signal to control logic that halts the fetching, decoding, and updating operations of the processor-driven mode *method* of operation.

30. The method of claim 22 wherein the step of selecting a mode of operation includes the steps of:

setting an interrupt redirect flag in a probe mode control register;

during operation in the processor-driven mode *method*, detecting a debug exception;

testing the interrupt redirect flag to determine if it has been set; *and* if the interrupt redirect flag has been set, then selecting the probe mode *method* with control logic that halts the fetching, decoding, and updating operations of the processor-driven mode of operation.

31. A computer circuit including a processor operating in one of a processor-driven mode wherein the circuit executes a series of macroinstructions stored in a computer memory and a probe mode wherein the processor receives and processes an external signal, said circuit comprising:

an external control unit that provides said external signal including an externally supplied command and probe mode instruction;

an access port coupled [to] *between the processor and* said external control unit, including:

a circuit for receiving and sending the external signal *from and to the external control unit; and* a circuit for sending information to the processor and receiving information from the processor;

control logic for controlling [the] *an* interface between the access port and the processor *by enabling the probe mode in which the externally supplied command is sent to the processor,* and a probe instruction register for holding a probe mode microinstruction received in the external signal;

an execution unit for executing microinstructions;

a mode selection unit for selecting between the processor-driven mode and the probe mode; and a microinstruction multiplexer that selects a microinstruction to be provided to the execution unit, said microinstruction multiplexer having inputs including a microinstruction decoded from a microinstruction from a processor-driven instruction path and a probe mode micro-instruction from the probe instruction register [not included in the processor-driven instruction path], said microinstruction multiplexer coupled to the mode selection unit to select one of said inputs *and the probe instruction register constituting part of a probe mode path that bypasses a decoder within the processor-driven instruction path that updates state information of the processor*.

* * * * *